(12) United States Patent
Huang et al.

(10) Patent No.: US 11,980,000 B2
(45) Date of Patent: May 7, 2024

(54) BACK FILM FOR DISPLAY DEVICE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Yuanyou Qiu, Beijing (CN); Yudiao Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 105 days.

(21) Appl. No.: 17/539,520

(22) Filed: Dec. 1, 2021

(65) Prior Publication Data
US 2022/0210939 A1 Jun. 30, 2022

(30) Foreign Application Priority Data
Dec. 24, 2020 (CN) .......................... 202011552198.6

(51) Int. Cl.
*H05K 5/03* (2006.01)
*B32B 3/26* (2006.01)
(Continued)

(52) U.S. Cl.
CPC ............... *H05K 5/03* (2013.01); *B32B 3/266* (2013.01); *B32B 27/08* (2013.01); *B32B 27/281* (2013.01); *B32B 27/283* (2013.01); *C09J 7/25* (2018.01); *C09J 7/38* (2018.01); *B32B 2307/536* (2013.01); *B32B 2307/732* (2013.01); *B32B 2457/20* (2013.01); *C09J 2203/326* (2013.01);
(Continued)

(58) Field of Classification Search
CPC ............... B32B 3/266; B32B 2457/20; B32B 2457/202; B32B 2457/204; B32B 2457/206; B32B 2457/208; G06F 1/1626; G06F 1/1633; G06F 1/1652
USPC .......................................... 428/131
See application file for complete search history.

(56) References Cited

U.S. PATENT DOCUMENTS

| 2002/0008799 A1 | 1/2002 | Ota et al. |
| 2006/0172882 A1 | 8/2006 | Leban |

(Continued)

FOREIGN PATENT DOCUMENTS

| CN | 107068710 A | 8/2017 |
| CN | 110071156 A | 7/2019 |

(Continued)

OTHER PUBLICATIONS

CN 202011552198.6 first office action.

*Primary Examiner* — Zachary M Davis
(74) *Attorney, Agent, or Firm* — IPro, PLLC

(57) ABSTRACT

A back film for a display device and the display device are provided in the present disclosure. The back film includes an opening region and a non-opening region, and the back film includes a first flexible material layer and a polyimide layer laminated one on another. An opening penetrating through the first flexible material layer and the second flexible material layer is formed in the back film, and a region corresponding to the opening is the opening region. The back film further includes a protection member covering the camera region.

12 Claims, 8 Drawing Sheets

(51) Int. Cl.
 *B32B 27/08* (2006.01)
 *B32B 27/28* (2006.01)
 *C09J 7/25* (2018.01)
 *C09J 7/38* (2018.01)
 *H05K 5/00* (2006.01)

(52) U.S. Cl.
 CPC .... *C09J 2301/302* (2020.08); *C09J 2479/086* (2013.01); *H05K 5/0017* (2013.01)

(56) References Cited

U.S. PATENT DOCUMENTS

| | | | |
|---|---|---|---|
| 2017/0170255 A1 | 6/2017 | Ha et al. | |
| 2017/0300736 A1* | 10/2017 | Song | G06V 40/1312 |
| 2018/0212168 A1 | 7/2018 | Toribatake | |
| 2019/0009498 A1* | 1/2019 | Yee | B32B 7/06 |
| 2019/0194498 A1* | 6/2019 | Takagi | B32B 37/06 |

FOREIGN PATENT DOCUMENTS

| | | |
|---|---|---|
| CN | 111725274 A | 9/2020 |
| CN | 111785175 A | 10/2020 |
| TW | 200423464 A | 11/2004 |

\* cited by examiner

--Related Art--

--Related Art--

BACK FILM FOR DISPLAY DEVICE AND DISPLAY DEVICE

CROSS-REFERENCE TO RELATED APPLICATIONS

This application claims a priority to Chinese Patent Application No. 202011552198.6 filed in China on Dec. 24, 2020, which is incorporated by reference herein.

TECHNICAL FIELD

The present disclosure relates to the field of display technology, in particular to a back film for a display device and the display device.

BACKGROUND

A flexible display panel has become a main trend of a display panel due to such advantages as small size, portability and flexibility. When an under-screen camera is designed for a mobile product, a polyethylene terephthalate (PET) film is usually used to protect a substrate.

SUMMARY

A back film for a display device is provided in the present disclosure. The back film includes an opening region and a non-opening region, and the back film includes a first flexible material layer and a second flexible material layer laminated one on another. An opening penetrating through the first flexible material layer and the second flexible material layer is formed in the back film, and a region corresponding to the opening is the opening region. The back film further includes a protection member covering the opening region.

According to the embodiments of the present disclosure, hardness of the protection member is not less than hardness of the second flexible material layer.

According to the embodiments of the present disclosure, the protection member includes a hardening plate located on a side of the second flexible material layer away from the first flexible material layer.

According to the embodiments of the present disclosure, Shore hardness of the hardening plate is greater than 80 HD.

According to the embodiments of the present disclosure, the back film for the display device further includes a protection layer located between the second flexible material layer and the hardening plate.

According to the embodiments of the present disclosure, the protection member includes a first filler located in the opening, and a transmittance of the first filler is greater than 90% when the first filler is exposed to light having a wavelength of 550 nm.

According to the embodiments of the present disclosure, a thickness of the first filler is equal to a sum of a thickness of the first flexible material layer and a thickness of the second flexible material layer.

According to the embodiments of the present disclosure, the protection member includes a second filler located in the opening, and the second filler is made of a same material as the second flexible material layer.

According to the embodiments of the present disclosure, a thickness of the second filler is less than a sum of a thickness of the first flexible material layer and a thickness of the second flexible material layer, the second filler has a first surface and a second surface opposite to each other, the first surface is in a same plane as a surface of the first flexible material layer away from the second flexible material layer, and the second surface forms a groove structure with a side wall of the opening. The protection member further includes an adhesive material, and at least a portion of the adhesive material is located in the groove structure.

According to the embodiments of the present disclosure, at least a portion of the adhesive material is located on the side of the second flexible material layer away from the first flexible material layer.

According to the embodiments of the present disclosure, adhesiveness of the adhesive material is not greater than adhesiveness of a pressure sensitive adhesive.

A method of forming a back film for a display device is further provided in the present disclosure, where the back film includes an opening region and a non-opening region, and the method includes: forming a first flexible material layer on a second flexible material layer; forming an opening penetrating through the first flexible material layer and the second flexible material layer, a region corresponding to the opening being the opening region; and forming a protection member covering the opening region.

According to the embodiments of the present disclosure, the forming the protection member includes: forming a hardening plate on a side of the second flexible material layer away from the first flexible material layer, an projection of the hardening plate onto the second flexible material layer covering the opening region.

According to the embodiments of the present disclosure, prior to forming the hardening plate on the side of the second flexible material layer away from the first flexible material layer, the method further includes: forming a protection layer on the side of the second flexible material layer away from the first flexible material layer.

According to the embodiments of the present disclosure, the forming the protection member includes: filling a first filler into the opening to form the protection member; where a transmittance of the first filler is greater than 90% when the first filler is exposed to light having a wavelength of 550 nm.

According to the embodiments of the present disclosure, a thickness of the first filler is equal to a sum of a thickness of the first flexible material layer and a thickness of the second flexible material layer.

According to the embodiments of the present disclosure, the forming the protection member includes: filling a second filler into the opening to form the protection member; where the second filler is made of a same material as the second flexible material layer.

According to the embodiments of the present disclosure, a thickness of the second filler is less than a sum of a thickness of the first flexible material layer and a thickness of the second flexible material layer, the second filler has a first surface and a second surface opposite to each other, the first surface is in a same plane as a surface of the first flexible material layer away from the second flexible material layer, and the second surface forms a groove structure with a side wall of the opening. The method further includes: filling at least a portion of an adhesive material into the groove structure, where adhesiveness of the adhesive material is not greater than adhesiveness of a pressure sensitive adhesive.

A display device is further provided in the present disclosure, including a camera corresponding to the opening and the above-mentioned back film for the display device.

According to the embodiments of the present disclosure, the display device further includes a panel located on a side of the first flexible material layer away from the second flexible material layer.

DETAILED DESCRIPTION

The embodiments of the present disclosure are described in detail hereinafter. The embodiments described hereinafter are for illustrative purposes only, which are used to explain the present disclosure, but shall not be construed as limiting the scope of the present disclosure. For techniques or conditions that are not specifically indicated in the embodiments, the procedures may be carried out in accordance with the techniques or conditions described in the literature in the art or in accordance with product specifications. The reagents used are conventional products available on the market without specifying the manufacturer.

It has been found that, due to poor foldable properties, it is impossible to apply a polyethylene terephthalate (PET) film to the field of foldable screens.

Therefore, it is important to develop a back film that is able to be applied to the field of foldable screens.

Figure 1:
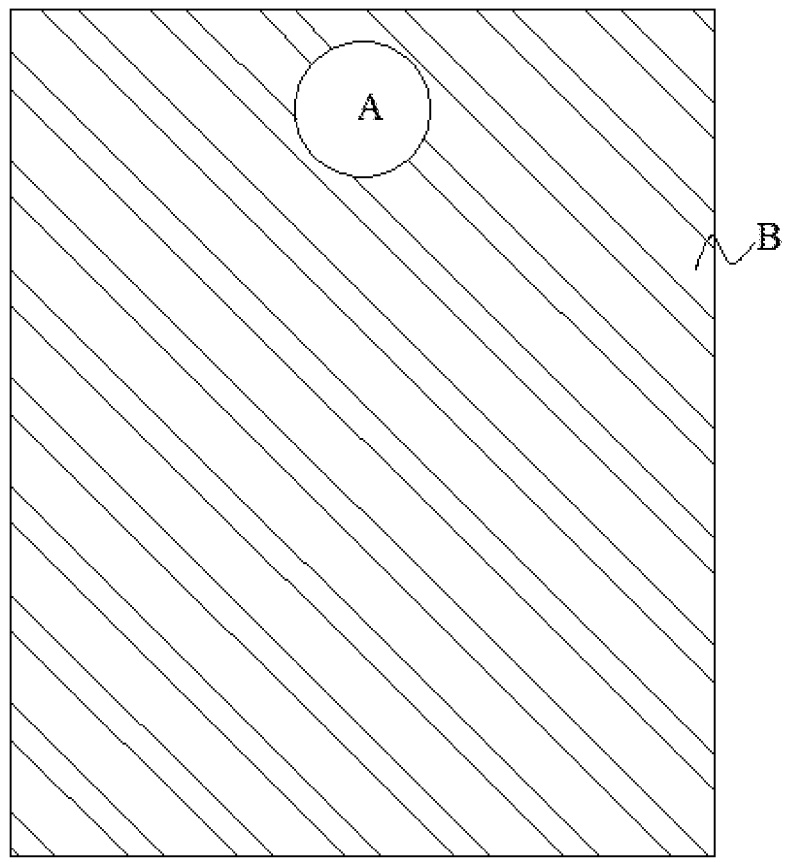
FIG. 1 is a top view of a polyimide layer.

As shown in FIG. 1, the back film includes an opening region A and a non-opening region B, and the opening region may correspond to a region where a camera or the like is located. In order to make the back film applicable in the field of foldable screens, it has been found that the commonly used polyethylene terephthalate (PET) film in the back film is replaced with a polyimide layer. It has been further found that, after replacing the polyethylene terephthalate (PET) film with the polyimide layer, due to a low transmittance of polyimide, it may adversely affect the camera-shooting effects. Thus, it is necessary to provide an opening in the polyimide layer.

Figure 2:
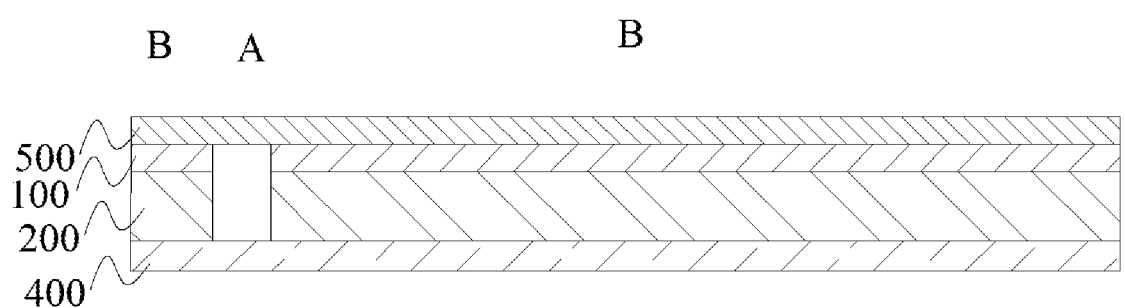
FIG. 2 is a schematic view showing a case where protection layers are attached to both sides of a back film.
Figure 3:
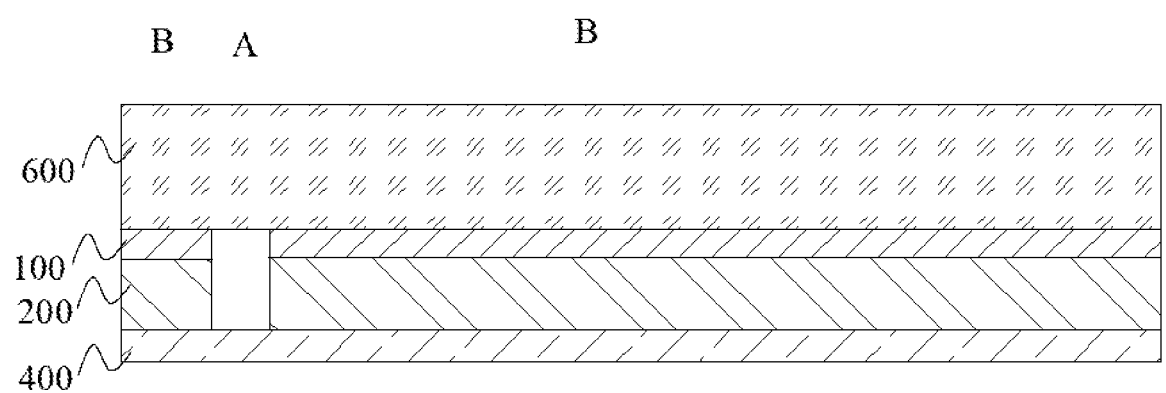
FIG. 3 is a schematic view showing a case where the back film is attached to a panel.

In some embodiments, protection layers, such as release films, may be arranged on both sides of the back film. Specifically, as shown in FIG. 2, a first protection layer 400 may be arranged on a side of a polyimide layer 200 away from a pressure sensitive adhesive layer 100, and a second protection layer 500 may be arranged on a side of the pressure sensitive adhesive layer 100 away from the polyimide layer 200. It should be appreciated that those skilled in the art may remove the protection layer(s) according to the needs. For example, when the back film needs to be attached to a panel, as shown in FIG. 3, the second protection layer 500 may be removed, and the back film is attached to the panel 600 on the side of the pressure sensitive adhesive layer 100 away from the polyimide layer 200.

Figure 4:
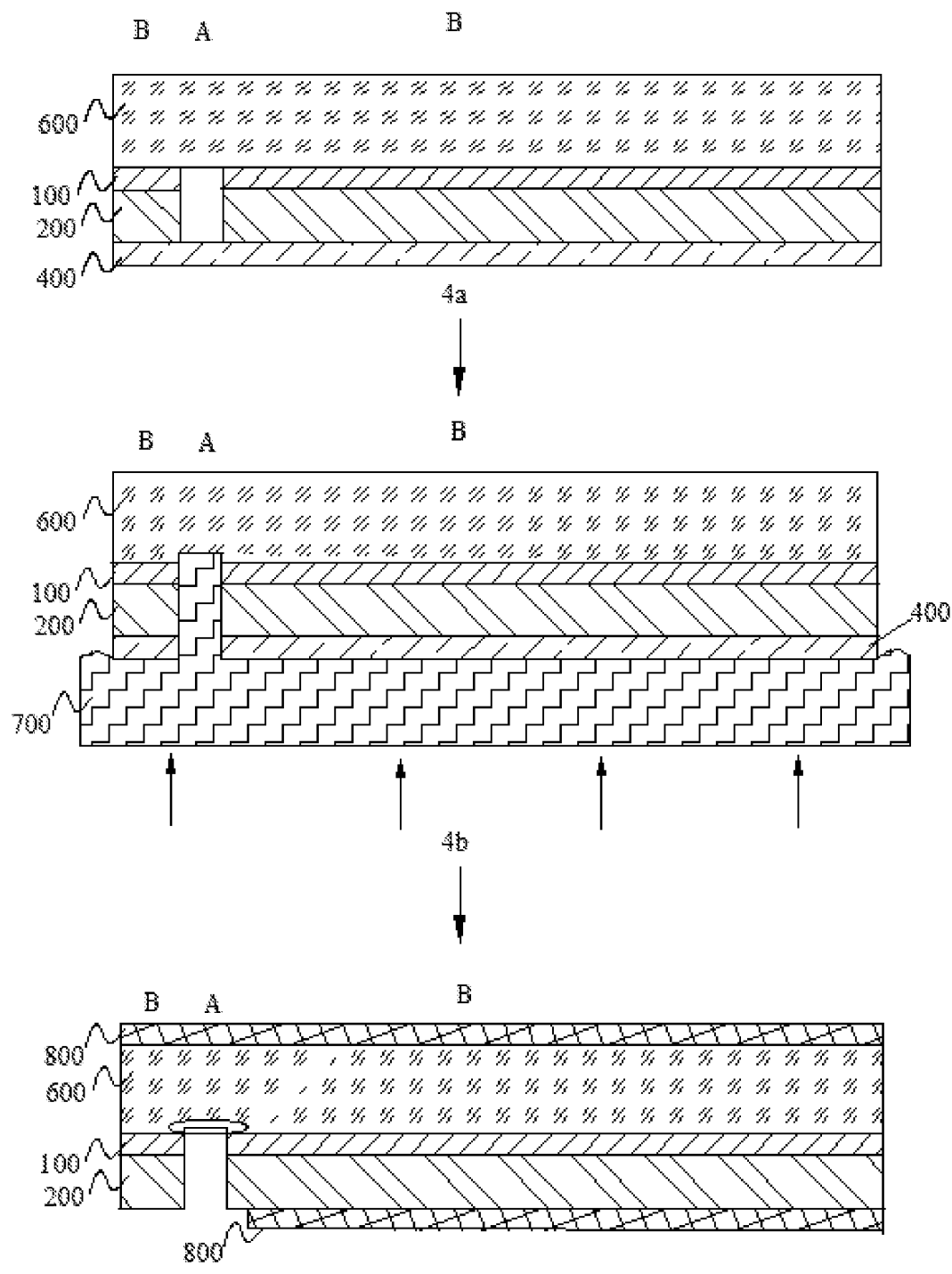
FIG. 4 is a schematic view showing a procedure of attaching the back film to the panel without a protection member.

As shown in FIG. 4, in the case that a protection member is not arranged on the back film, when attachment is performed on the back film by using an elastic material (such as silicone), a force is applied on a side of a silicone 700 away from the panel 600, an outer side of the first protection layer 400 (a side of the first protection layer 400 away from the polyimide layer 200) is subjected to a stress of the silicone 700, and an inner side of the first protection layer 400 (a side of the first protection layer 400 close to the polyimide layer 200) is an opening region which is not subjected to the stress. The first protection layer 400 located in the opening region is under the effect of a stress difference between the inner side and the outer side, and the silicone 700 may break through the first protection layer 400 located below the opening region A. As a result, the silicone 700 is filled into the opening, and the force is applied to the panel 600 above the opening, so as to form an imprint on the panel 600, and specifically form an imprint at an elliptical position in FIG. 4c, thereby adversely affecting the camera-shooting effects.

That is, it is impossible to apply the conventional back film to the field of foldable screens, and it has been found that after the polyethylene terephthalate (PET) film is replaced with the polyimide layer, it is necessary to provide the opening in the polyimide layer, but after the opening is formed in the polyimide layer, there is still an issue that the imprint is easily formed during the attachment, which adversely affects the camera-shooting effects.

An objective of the present disclosure is to address at least one of the above technical issues, at least to some extent.

Figure 5:
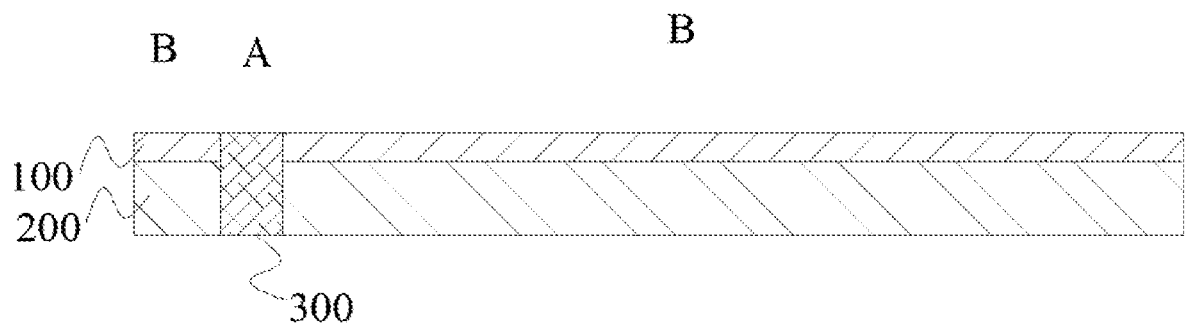
FIG. 5 is a schematic view showing a back film for a display device according to one embodiment of the present disclosure.

In view of the above technical defects, a back film for a display device is provided in the present disclosure, as shown in FIG. 5, the back film includes an opening region A and a non-opening region B, and the back film includes a first flexible material layer 100 and a second flexible material layer 200 laminated one on another. An opening penetrating through the first flexible material layer 100 and the second flexible material layer 200 is formed in the back film, and a region corresponding to the opening is an opening region A. The back film further includes a protection member 300 covering the opening region A.

In some embodiments, the first flexible material layer is a pressure sensitive adhesives (PSA) layer, and a material which the second flexible material layer is made mainly includes polyimide (PI).

In some embodiments, hardness of the protection member 300 is not less than hardness of the second flexible material layer.

It should be appreciated that, a shape and a position of the protection member 300 in FIG. 5 are for illustrative purposes only, as long as a projection of the protection member 300 onto the first protection layer 400 covers the opening region A, but shall not be construed as a limitation on the protection member. Thus, the protection member is able to protect the opening region (such as a camera region), so as to avoid the formation of the imprint.

Figure 6:
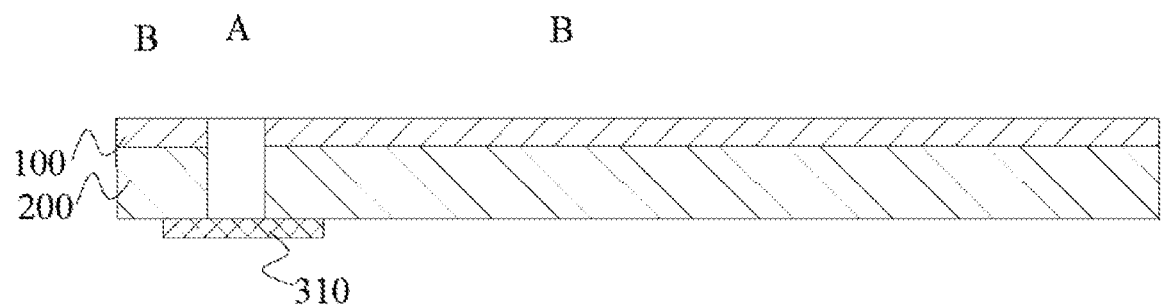
FIG. 6 is another schematic view showing the back film for the display device according to one embodiment of the present disclosure.

According to the embodiments of the present disclosure, as shown in FIG. 6, the protection member 300 may include a hardening plate 310 located on a side of the second flexible material layer 200 away from the first flexible material layer 100.

As a result, the hardening plate 310 blocks the silicone 700 outside of the opening, so as to prevent the silicone from entering the opening during attaching, thereby avoiding the formation of the imprint. It should be particularly appreciated that the protection member 300 covering the camera region should be understood in a broad sense. That is, in case the protection member 300 is the hardening plate as described above, it may be that the projection of the protection member 300 on to a plane where the second flexible material layer is located covers the camera region. Thus, it is able to avoid the formation of the imprint.

According to the embodiments of the present disclosure, Shore hardness of the hardening plate is greater than 80 HD. As a result, the hardening plate may protect the camera region in a better manner, so as to provide the better camera-shooting effects.

According to the embodiments of the present disclosure, the protection member 300 includes a first filler 320 located in the opening, and a transmittance of the first filler is greater than 90% when the first filler is exposed to light having a wavelength of 550 nm. Hence, it is able to avoid the formation of the imprint in a better manner.

Figure 7:
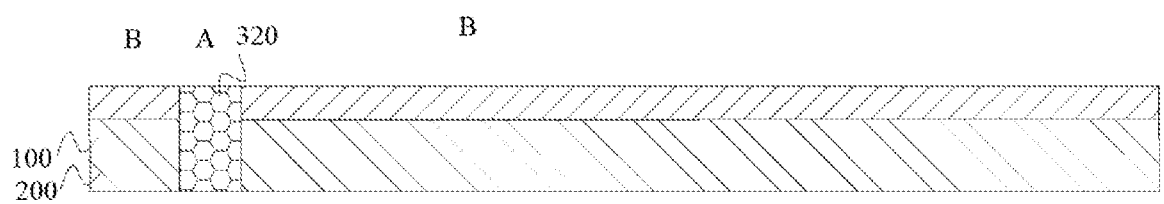
FIG. 7 is yet another schematic view showing the back film for the display device according to one embodiment of the present disclosure.

According to the embodiments of the present disclosure, as shown in FIG. 7, the first filler 320 may be made of a high transmittance material. In some embodiments, a thickness of the first filler 320 is equal to a sum of a thickness of the first flexible material layer 100 and a thickness of the thickness of the second flexible material layer 200.

Thus, more light may enter the camera region, so as to provide the better camera-shooting effects. It has been found that, in the case that a material having a transmittance of 90% or less is used, it is impossible to ensure that sufficient light enters the camera region, which may adversely affect the camera-shooting effects. In the case that a material having a high transmittance of more than 90% is used, it is able to provide the better camera-shooting effects. A specific and optional compound for the high transmittance material is not particularly defined in the present disclosure, as long as it satisfies the transmittance of the material is greater than 90% when the material is exposed to light having a wavelength of 550 nm. In addition, since the first filler has high hardness, holes or steps forming level differences do not exist in the camera region when the panel is attached to the back film, thereby to avoid the formation of the imprint.

Figure 8:
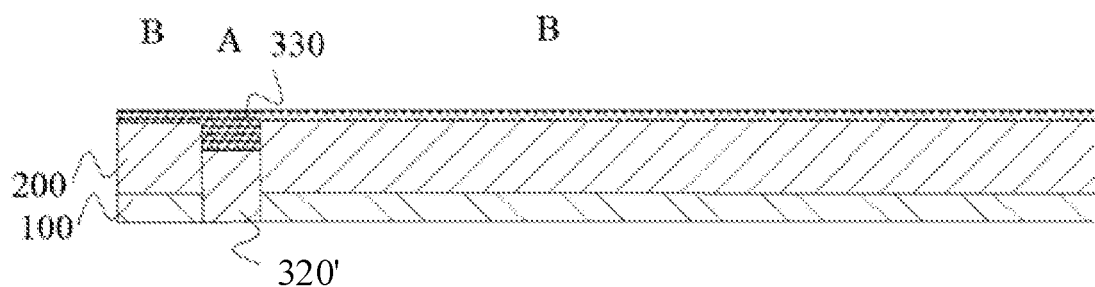
FIG. 8 is still yet another schematic view showing the back film for the display device according to one embodiment of the present disclosure.

According to the embodiments of the present disclosure, as shown in FIG. 8, the protection member includes a second filler 320' located in the opening, and the second filler is made of a same material as the second flexible material layer. In some embodiments, the second filler may be made of polyimide.

In some embodiments, a thickness of the second filler 320' is less than a sum of a thickness of the first flexible material layer 100 and a thickness of the second flexible material layer 200. The second filler 320' has a first surface and a second surface opposite to each other, and the first surface is in a same plane as a surface of the first flexible material layer 100 away from the second flexible material layer 200, and the second surface forms a groove structure with the side wall of the opening. The protection member 300 further includes an adhesive material 330, and at least a portion of the adhesive material 330 is located in the groove structure.

Thus, the back film may be made free of level difference, and the silicone does not enter the opening during attaching, thereby avoiding the formation of the imprint.

According to the embodiments of the present disclosure, at least a portion of the adhesive material 330 is located on the side of the second flexible material layer 200 away from the first flexible material layer 100.

According to the embodiments of the present disclosure, adhesiveness of the adhesive material is not greater than adhesiveness of the pressure sensitive adhesive.

As a result, it is able to remove the polyimide material in the opening easily, so as to ensure that sufficient light enters the camera region, thereby to provide the better camera-shooting effects. Specifically, the adhesive material 330 may be removed after attaching the back film to the panel. Since the adhesive material 330 has some adhesiveness, it is able to remove the second filler 320' made of polyimide together with the adhesive material 330. Thus, it is able to eliminate the level difference at the opening of the camera region via the adhesive material 330 and the second filler 320' during the attachment, so as to avoid the formation of the imprint. In addition, the second filler at the opening is removed after the attachment, so as to ensure the sufficient light received by the camera. For easier removal of the adhesive material and the filler, the adhesive material may be formed on a surface of the second flexible material layer 200 away from the first flexible material layer 100, and the adhesive material is filled into the groove structure formed by the second filler and the opening. Thus, it is able to remove the adhesive material 330 and the second filler 320' in a convenient and integral manner.

Figure 9:
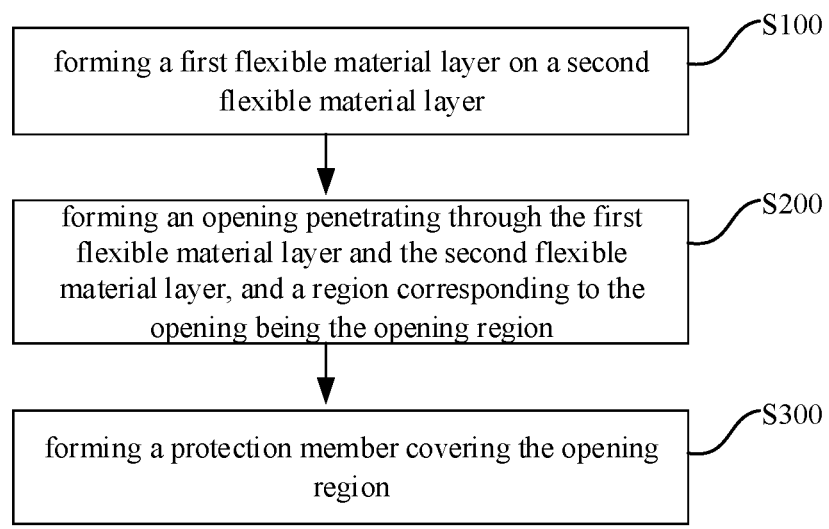
FIG. 9 is a flow chart of a method of forming a back film for a display device according to one embodiment of the present disclosure.

A method of forming the back film for the display device is further provided in the present disclosure, as shown in FIG. 9, the back film includes an opening region and a non-opening region and the method includes the step S100, S200 and S300.

S100, forming a first flexible material layer on a second flexible material layer.

According to the embodiments of the present disclosure, the first flexible material layer is formed on the second flexible material layer in the step. The thickness of the second flexible material layer and the thickness of the first flexible material layer are not limited in the present disclosure, and may be adjusted by the skilled person according to usage requirements.

S200, forming an opening penetrating through the first flexible material layer and the second flexible material layer, and a region corresponding to the opening being the opening region.

According to the embodiments of the present disclosure, the opening penetrating through the first flexible material layer and the second flexible material layer is formed in the step. The opening may be of a circular shape. A diameter of a circle is not limited in the present disclosure, and may be adjusted by the skilled person according to the usage requirements, as long as it is able to expose the camera region and ensure the sufficient light received by the camera.

S300, forming a protection member covering the opening region.

According to the embodiments of the present disclosure, the protection member covering the opening region (such as a camera region) is formed in the step. As mentioned above, due to the greater hardness of the protection member, the protection member may be used to protect the camera region from forming the aforementioned imprint in the subsequent attaching process.

It should be appreciated that "covering" herein means that an area of a projection of the protection member is greater than or equal to an area of the opening region.

It should be appreciated that the numbering of the steps (such as S100, S200 and S300) does not imply a limitation on the order of the steps, which may vary depending on circumstances.

According to specific embodiments of the present disclosure, various steps of the method are described in detail below. When the protection member 300 is the hardening plate 310, the method of forming the back film for the display device may include the following steps.

Figure 10:
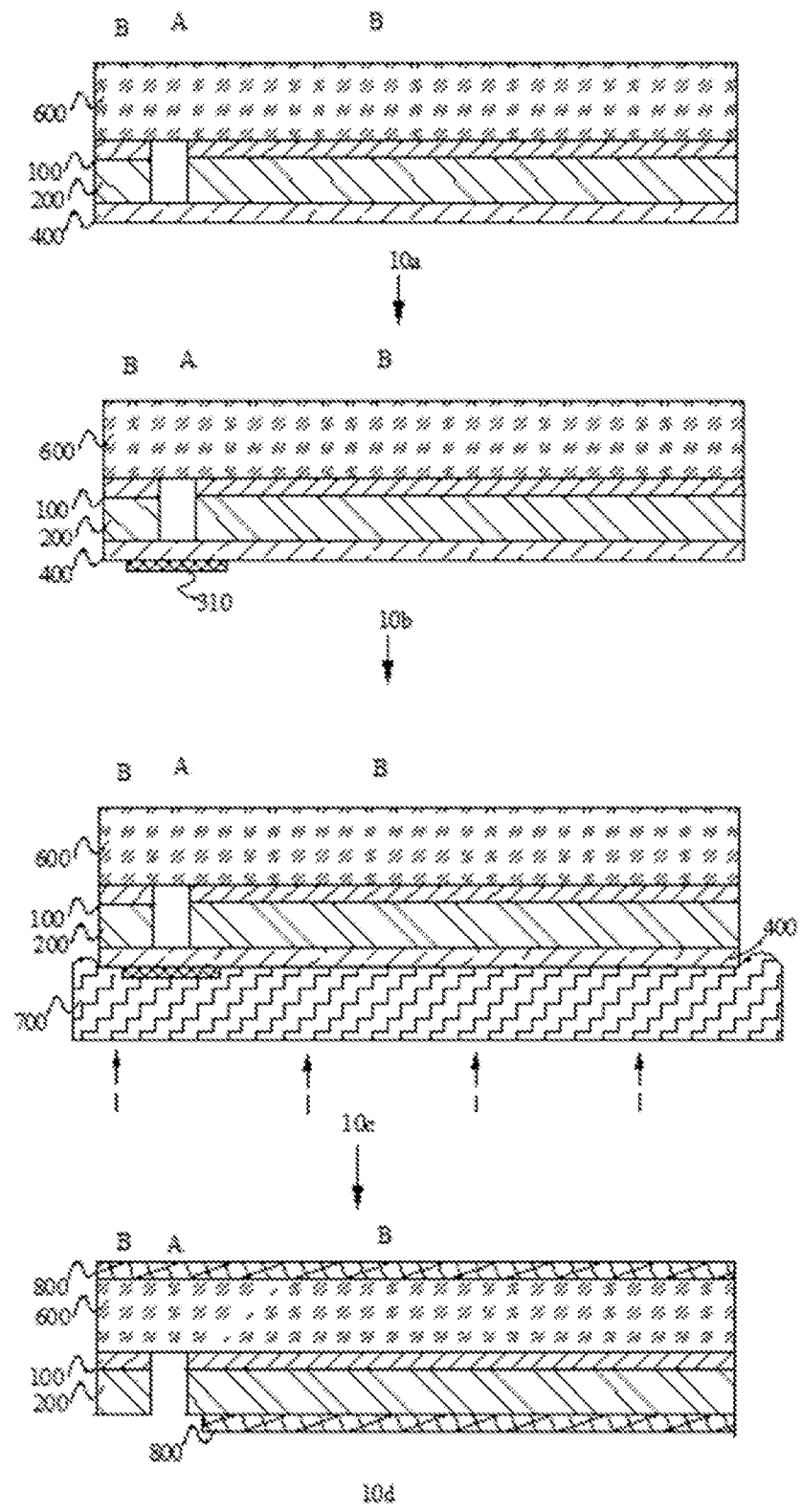
FIG. 10 is another flow chart of the method of forming the back film for the display device according to one embodiment of the present disclosure.

First, the back film including the first protection layer 400 and the second protection layer 500 as shown in FIG. 2 is provided, the second protection layer 500 is removed, and then the back film is attached to the panel 600, to obtain a structure shown in FIG. 10a. The first protection layer 400 on a side of the back film away from the panel 600, is used to prevent the silicone 700 from directly contacting the second flexible material layer 200 during the attaching process, thereby to protect the second flexible material layer 200.

Subsequently, the hardening plate 310 is arranged on the side of the first protection layer 400 away from the second flexible material layer 200, and the projection of the hardening plate 310 onto the first protection layer 400 covers the opening region A, and a resultant structure is shown in FIG. 10b.

FIG. 10c is a schematic view showing a procedure of attaching the back film in FIG. 10b to the panel, and the procedure includes: the silicone 700 is coated on a surface of the first protection layer 400 away from the second flexible material layer 200, and a force is applied to the silicone 700 towards the panel 600, so as to attach various layered structures. Due to the greater hardness of the hardening plate 310, the silicone 700 is blocked from entering the opening, thereby avoiding the formation of the imprint.

After the attaching is finished, the silicone 700, the first protection layer 400 and the hardening plate 310 may be removed. At this time, as there is no other blocking substance in the camera region, light may enter the camera region, so as to obtain the better camera-shooting effects.

Subsequently, as shown in FIG. 10d, the method further includes forming heat dissipation films 800 in the display device, the heat dissipation films 800 are located on a surface of the panel 600 away from the first flexible material layer 100 and a surface of the second flexible material layer 200 away from the first flexible material layer 100.

When the protection member 300 is the first filler 320, the method of forming the back film for the display device may include the following steps.

Figure 11:
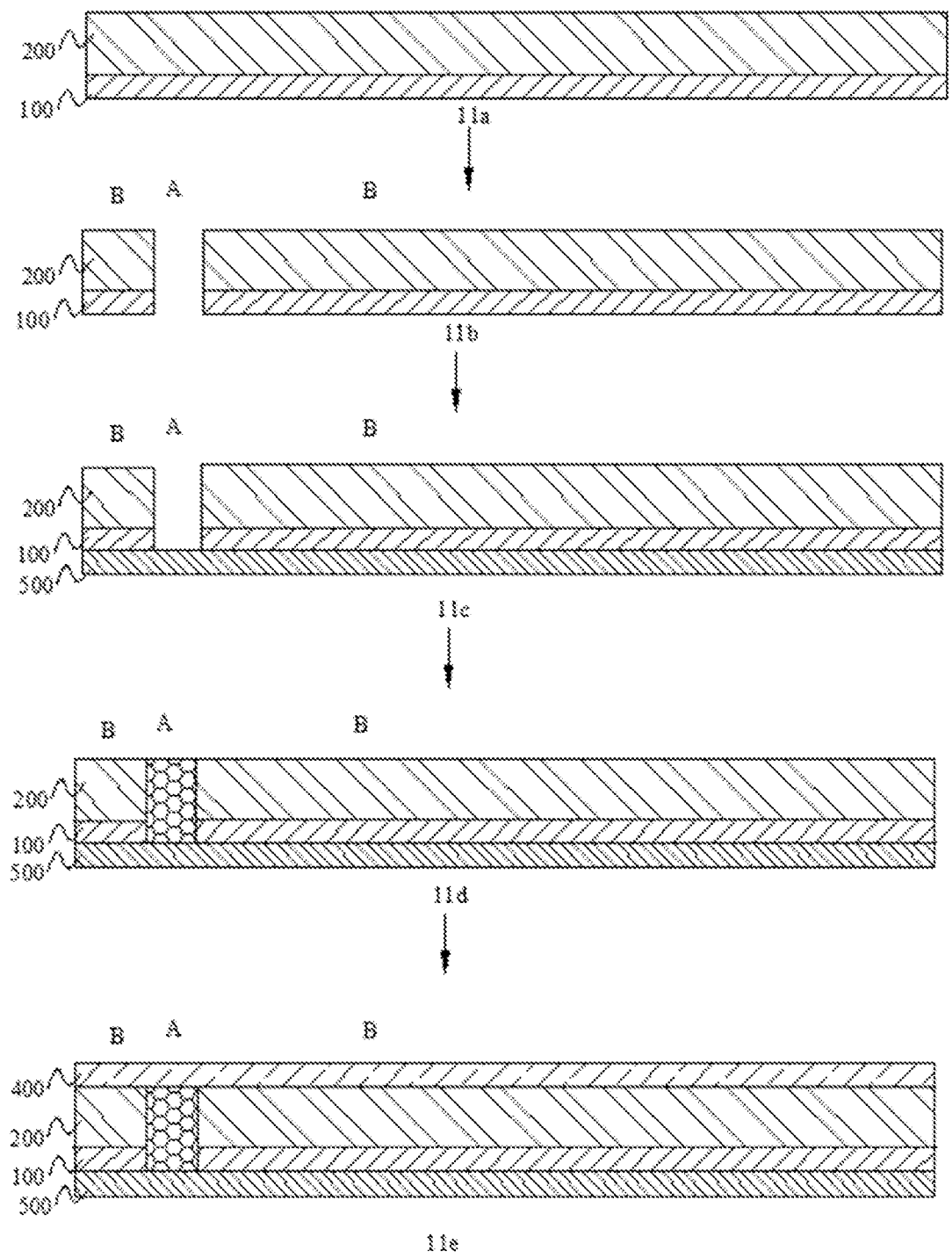
FIG. 11 is yet another flow chart of the method of forming the back film for the display device according to one embodiment of the present disclosure.

A laminated structure of the first flexible material layer 100 and the second flexible material layer 200 is provided, as shown in FIG. 11a.

A circular opening penetrating through the first flexible material layer 100 and the second flexible material layer 200 is formed through die-cutting, as shown in FIG. 11b.

The second protection layer 500 is formed on the side of the first flexible material layer 100 away from the second flexible material layer 200, as shown in FIG. 11c.

A high transmittance material is filled into the opening, and a thickness of the high transmittance material is equal to a sum of a thickness of the first flexible material layer 100 and a thickness of the second flexible material layer 200, as shown in FIG. 11d.

The first protection layer 400 is formed on the side of the second flexible material layer 200 away from the first flexible material layer 100, as shown in FIG. 11e.

When the protection member 300 is the second filler 320' and the second filler 320' is made of polyimide, the method of forming the back film for the display device may include the following steps.

Figure 12:
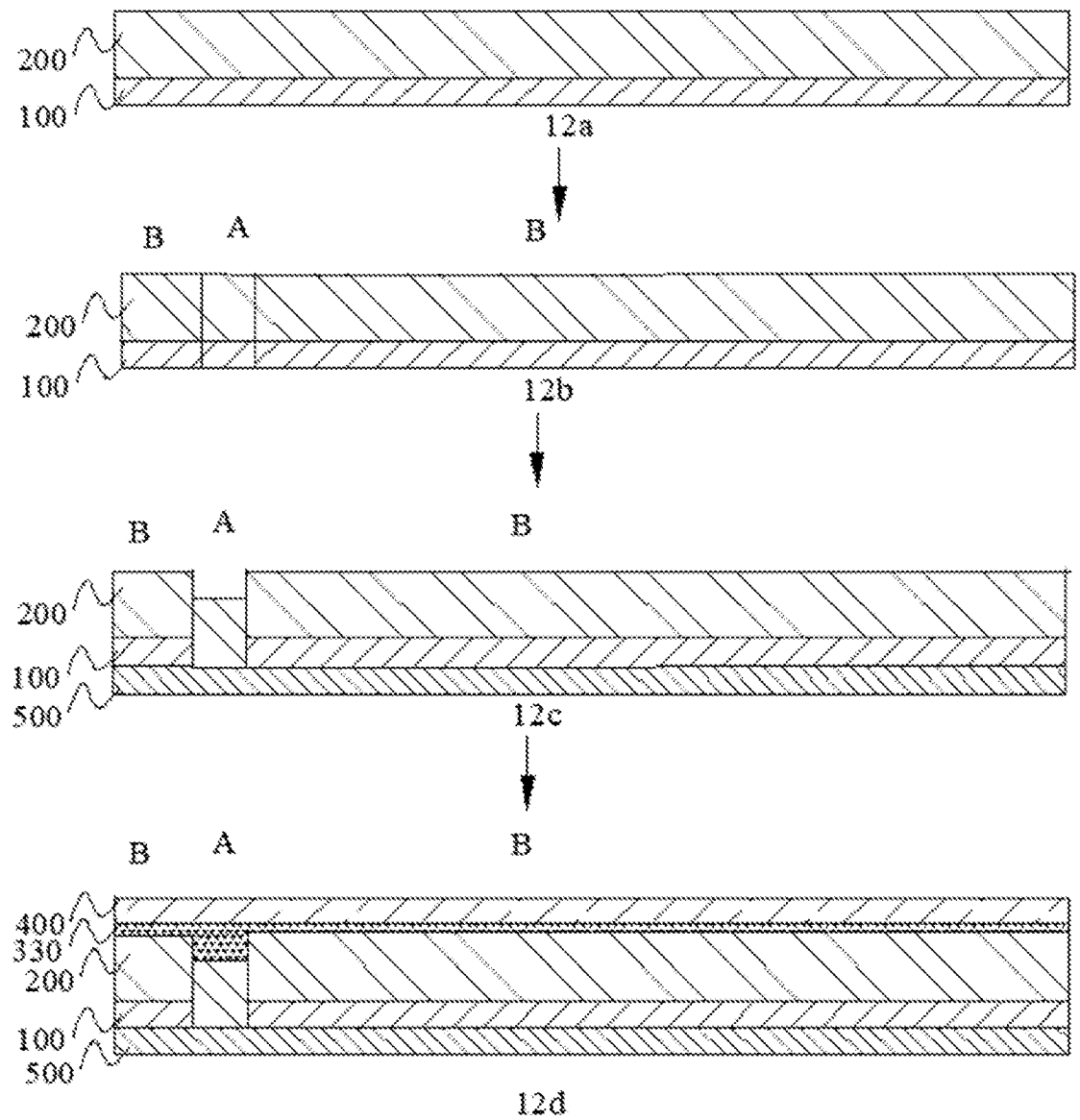
FIG. 12 is still yet another flow chart of the method of forming the back film for the display device according to one embodiment of the present disclosure.

A laminated structure of the first flexible material layer 100 and the second flexible material layer 200 is provided, as shown in FIG. 12a.

Die-cutting is performed in the opening region A of the first flexible material layer 100 and the second flexible material layer 200, as shown in FIG. 12b. Due to the adhesiveness of the polyimide, by controlling the die-cutting process, a first flexible material (such as a pressure sensitive adhesive material) and a second flexible material (such as a polyimide material) at the opening region A may be disconnected from the first flexible material layer 100 and the second flexible material layer 200 at other positions, but the first flexible material layer and the second flexible material layer at the opening region A are still in the back film.

The first flexible material at the opening region A in FIG. 12b is removed, the second flexible material is reserved in the opening as the second filler, the second protection layer 500 is formed on the side of the first flexible material layer 100 away from the second flexible material layer 200, as shown in FIG. 12c, and a groove structure is formed at the opening.

The adhesive material 330 is filled in the groove structure, and further coated on the side of the second flexible material layer 200 away from the first flexible material layer 100, so as to form a layered structure. Next, the first protection layer 400 is formed on a side of the layered structure composed of the adhesive material 330 away from the second flexible material layer 200, as shown in FIG. 12d. Thus, during attaching, the second protection layer 500 may be removed, and the first flexible material layer 100 is attached to the panel. Next, the silicone 700 is coated on the side of the first protection layer 400 away from the second flexible material layer 200, and a pressure force towards the second flexible material layer 200 is applied to the silicone 700. The back film has no level differences at the opening region A in the structure of FIG. 12d, thereby no imprint is formed on the panel.

Further, in FIG. 12d, in the case that the opening is filled with the polyimide material with poor transmittance, the camera-shooting effects will be adversely affected. Therefore, the first protection layer 400 may be removed after the attaching process is finished. Due to the adhesiveness of the adhesive material 330, the adhesive material 330 is adhered to the polyimide material in the opening. Thus, when the first protection layer 400 and the adhesive material 330 are moved, the polyimide material in the opening is removed together. After removal, the opening is free of material, so as to allow sufficient light to enter the camera region, thereby to provide the better camera-shooting effects. Through the design of the present disclosure, it is able not only to avoid the formation of the imprint during the attaching process, but also to allow more light to enter the camera region, thereby to provide the better camera-shooting effects.

There is no imprint in the camera region when the display device is formed by using the back film of the present disclosure, thereby to provide the better camera-shooting effects.

A display device including a camera corresponding to the opening and the back film for the display device described above is further provided in the present disclosure. Thus, the display device has all the features and advantages of the back film for the display device described above, which will not be repeated herein.

According to an embodiment of the present disclosure, the display device further includes a panel arranged on a side of the first flexible material layer away from the second flexible material layer.

It should be appreciated that, such words as "first" and "second" are merely for illustrative purposes, rather than to implicitly or explicitly indicate the number of the defined technical features. In the above description, such words as "inside" and "outside", "on/above", "under/below", "front" and "back" may be used to indicate directions or positions as viewed in the drawings, and they are merely used to facilitate the description in the present disclosure, rather than to indicate or imply that a device or member must be arranged or operated at a specific position.

The embodiments of the present disclosure have been described in detail above, however, the present disclosure is not limited to the specific details of the above embodiments, and various simple modifications can be made to the technical solutions of the present disclosure within the scope of the technical concept of the present disclosure, which also shall fall within the scope of the present disclosure. Furthermore, it should be appreciated that the specific features described in the above embodiments can be combined in any suitable manner without contradiction.

In the descriptions of this specification, descriptions with reference to the terms such as "an embodiment", "some embodiments", "examples", "specific examples", or "some examples" mean that specific features, structures, materials, or characteristics described in conjunction with the embodiment(s) or example(s) are included in at least one embodiment or example of the present disclosure. In this specification, the illustrative representations of the above terms do not necessarily refer to the same embodiments or examples. Moreover, the specific features, structures, materials, or characteristics as described may be combined in any one or more embodiments or examples in an appropriate manner. In addition, without contradicting each other, those skilled in the art may join and combine different embodiments or examples and features of the different embodiments or examples described in this specification.

Although the embodiments of the present disclosure are illustrated and described in the above, it should be appreciated that the above embodiments are for illustrative purpose only, but shall not be construed as limiting the scope of the present disclosure. Changes, modifications, substitutions and variations of the above embodiments may be made by those of ordinary shill in the art within the scope of the present disclosure.

What is claimed is:

1. A back film for a display device, wherein the back film comprises an opening region and a non-opening region, and the back film comprises a first flexible material layer and a second flexible material layer laminated one on another;

an opening penetrating through the first flexible material layer and the second flexible material layer is formed in the back film, and a region corresponding to the opening is the opening region; and the back film further comprises a protection member covering the opening region; and wherein the protection member comprises a hardening plate located on a side of the second flexible material layer away from the first flexible material layer.

2. The back film for the display device according to claim 1, wherein hardness of the protection member is not less than hardness of the second flexible material layer.

3. The back film for the display device according to claim 1, wherein Shore hardness of the hardening plate is greater than 80 HD.

4. The back film for the display device according to claim 1, further comprising a protection layer located between the second flexible material layer and the hardening plate.

5. The back film for the display device according to claim 2, wherein the protection member comprises a first filler located in the opening, and a transmittance of the first filler is greater than 90% when the first filler is exposed to light having a wavelength of 550 nm.

6. The back film for the display device according to claim 5, wherein a thickness of the first filler is equal to a sum of a thickness of the first flexible material layer and a thickness of the second flexible material layer.

7. The back film for the display device according to claim 2, wherein the protection member comprises a second filler located in the opening, and the second filler is made of a same material as the second flexible material layer.

8. The back film for the display device according to claim 7, wherein a thickness of the second filler is less than a sum of a thickness of the first flexible material layer and a thickness of the second flexible material layer;

the second filler has a first surface and a second surface opposite to each other, the first surface is in a same plane as a surface of the first flexible material layer away from the second flexible material layer, and the second surface forms a groove structure with a side wall of the opening;

the protection member further comprises an adhesive material, and at least a portion of the adhesive material is located in the groove structure.

9. The back film for the display device according to claim 8, wherein at least a portion of the adhesive material is located on the side of the second flexible material layer away from the first flexible material layer.

10. The back film for a display device according to claim 8, wherein adhesiveness of the adhesive material is not greater than adhesiveness of a pressure sensitive adhesive.

11. A display device, comprising a camera corresponding to the opening and the back film for the display device according to claim 1.

12. The display device according to claim 11, further comprising a panel located on a side of the first flexible material layer away from the second flexible material layer.

* * * * *